United States Patent [19]

Usui

[11] Patent Number: 4,989,060
[45] Date of Patent: Jan. 29, 1991

[54] SOLID-STATE IMAGING DEVICE WITH PIXELS HAVING WEIGHTED SENSITIVITY DISTRIBUTION

[75] Inventor: Yoshiko Usui, Tokyo, Japan

[73] Assignee: Canon Kabushiki Kaisha, Tokyo, Japan

[21] Appl. No.: 541,192

[22] Filed: Jun. 22, 1990

Related U.S. Application Data

[63] Continuation of Ser. No. 415,460, Oct. 2, 1989, abandoned, which is a continuation of Ser. No. 113,067, Oct. 27, 1987, abandoned.

[30] Foreign Application Priority Data

Oct. 29, 1986 [JP] Japan ................................ 61-255758

[51] Int. Cl.$^5$ ..................... H01L 27/14; H01L 31/00; H01L 29/78; H01J 40/14
[52] U.S. Cl. ........................................ 357/30; 357/24; 250/208.1
[58] Field of Search .............................. 357/30, 24 LP; 250/208.1

[56] References Cited

U.S. PATENT DOCUMENTS

| | | | |
|---|---|---|---|
| 3,996,599 | 12/1976 | King | 357/30 D |
| 4,309,604 | 1/1982 | Yoshikawa et al. | 357/30 D |
| 4,318,115 | 3/1982 | Yoshikawa et al. | 357/30 D |
| 4,366,377 | 12/1982 | Notthoff et al. | 357/30 D |

Primary Examiner—Gene M. Munson

[57] ABSTRACT

A solid-state imaging device having weighted sensitivity distribution includes a pixel having a main area and at least one sub-area positioned adjacent the main area. Each of the main and sub-areas produces an output signal. A processing circuit is provided for receiving the output signals from the main and sub-areas, suppressing an intensity of the sub-area output signal, inverting a polarity of the sub-area output signal, and combining the suppressed and inverted sub-area output signal with the main area output signal to provide a pixel output signal having enhanced sensitivity.

5 Claims, 6 Drawing Sheets

(A)

(B)

SOLID-STATE IMAGING DEVICE WITH PIXELS HAVING WEIGHTED SENSITIVITY DISTRIBUTION

This application is a continuation of application Ser. No. 415,460, filed Oct. 2, 1989, which is a continuation of Ser. No. 113,067, filed Oct. 27, 1987, both now abandoned.

BACKGROUND OF THE INVENTION

1. Field of the Invention

The present invention relates to a solid-state imaging device used for photoelectric conversion.

2. Related Background Art

Conventionally such solid-state imaging device is constructed by arranging pixels of lateral lengths a, b of several microns to several tens of microns as shown in FIG. 1(A) by a number of several hundred to several thousands as shown in FIG. 1(B). Each pixel has uniform sensitivity distribution over the entire area as shown in FIG. 2. Said sensitivity distribution is one-dimensionally shown in FIG. 3, and is represented by:

$$g(x) = \begin{cases} 1 & -a/2 > x > a/2 \\ 0 & \text{elsewhere} \end{cases} \quad (1)$$

When an aperture having such distribution is illuminated with light, there is obtained a resolution as shown by a solid line in FIG. 4, by diffraction.

The equation (1) can be Fourier transformed as follows:

$$\begin{aligned} G(u) &= g \int_{-\infty}^{\infty} (x) e^{-2\pi j u} du \\ &= \int_{-a/2}^{a/2} e^{-2\pi j u} d\bar{u} \\ &= -\frac{1}{2\pi j} e^{-2\pi j u} \Big|_{-a/2}^{a/2} \\ &= -\frac{1}{2\pi j} (e^{-\pi j a} - e^{\pi j a}) \\ &= a \frac{\sin(a\pi)}{a\pi} \end{aligned} \quad (2)$$

and the trajectory of the equation (3) corresponds to the solid line in FIG. 4. In comparison with the complete resolution shown by a broken line in FIG. 4, the actually obtained resolution becomes deteriorated as indicated by the solid line, so that the read image becomes blurred.

SUMMARY OF THE INVENTION

The object of the present invention is to provide a solid-state imaging device not associated with the above-mentioned drawbacks and provided with an improved resolution.

The above-mentioned object can be achieved, according to the present invention, by a solid-state imaging device in which each pixel has a weighted distribution of sensitivity.

A simple structure having small pixels on both sides of a pixel improves the effective sensitivity distribution and enables effective edge enhancement.

DETAILED DESCRIPTION OF THE PREFERRED EMBODIMENTS

Now the present invention will be clarified in detail by embodiments thereof shown in the attached drawings.

Figure 5:
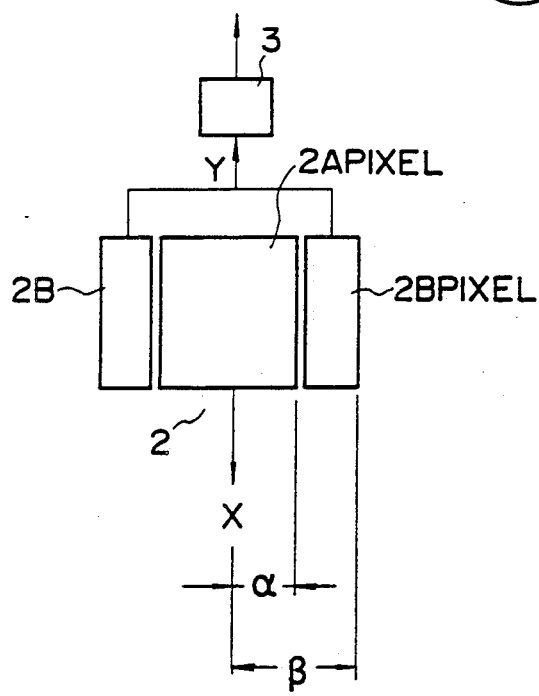
FIG. 5 is a schematic view of a pixel of a solid-state imaging device embodying the present invention.
Figure 6:
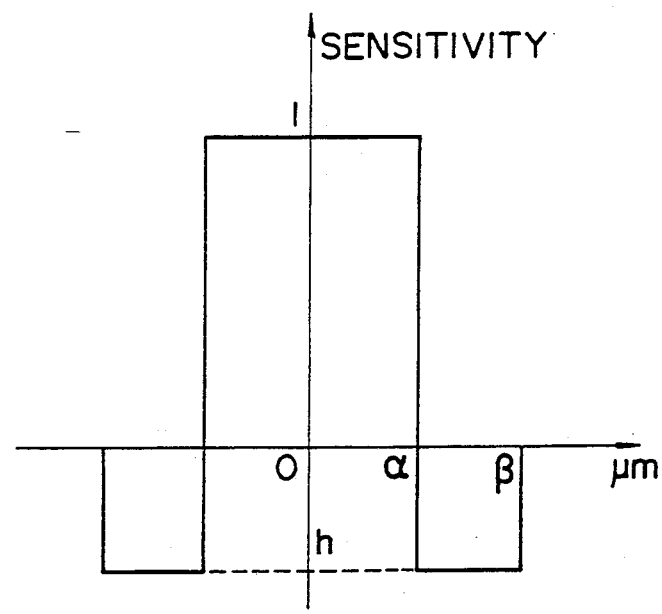
FIG. 6 is a chart showing a sensitivity distribution of the embodiment shown in FIG. 5.

FIG. 5 schematically shows an embodiment of the solid-state imaging device of the present invention. A pixel 2 of said solid-state imaging device is composed of a pixel 2A and two pixels 2B, 2B placed on both sides of pixel. The output Y of said pixels 2B, 2B is converted by a converter circuit 3 into a negative signal and is synthesized with the output signal X of the pixel 2A. As the result, the pixel 2 has a sensitivity distribution as shown in FIG. 6. In FIGS. 5 and 6, α and β respectively indicate the distances from the center of the pixel 2 to the ends of the pixels 2A and 2B. Also the value h in FIG. 6 can be arbitrarily varied by suppressing the converted output signal of the pixels 2B.

Figure 7:
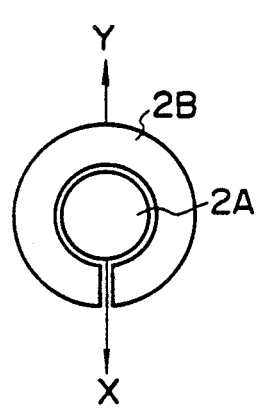
FIGS. 7 and 8 are schematic views showing the structures of a pixel in other embodiments.
Figure 8:
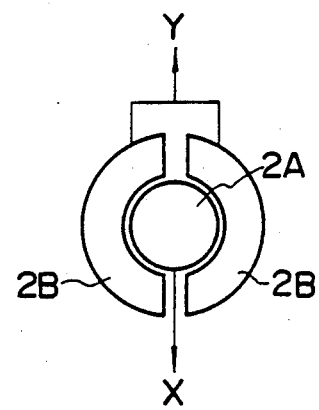

FIGS. 7 and 8 illustrate other embodiments of the solid-state imaging device of the present invention, having circular pixels. In FIG. 7 a pixel 2A is surrounded by a pixel 2B, while in FIG. 8 a pixel 2A is placed between two pixels 2B, 2B.

Figure 9:
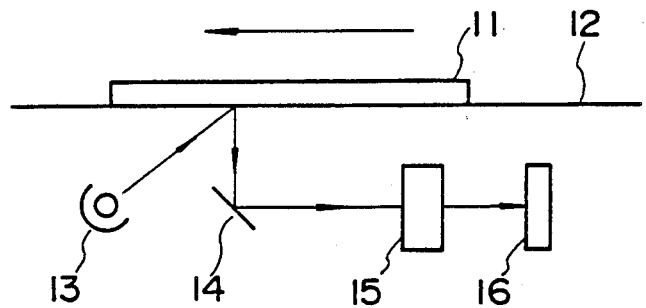
FIG. 9 is a schematic view of a copying machine employing a CCD sensor embodying the present invention.
Figure 10:
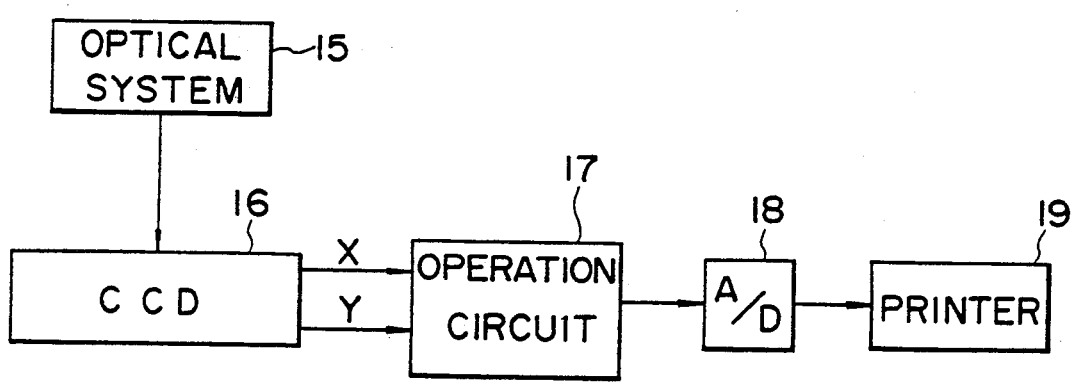
FIG. 10 is a block diagram of the electric circuit of a printer employing a CCD sensor embodying the present invention.

FIGS. 9, 10 illustrate examples of application of CCD sensors embodying the present invention.

FIG. 9 shows a copying machine employing a CCD sensor of the present invention, wherein shown are an original document 11; an original supporting glass 12; an illuminating system 13; a mirror 14; an imaging optical system 15; and a CCD sensor 16 of the present invention.

In response to the actuation of an unrepresented start button, the original support 12 starts to move in a direction indicated by the arrow, whereby the original document 11 is read. The original document 11 is illuminated by the illuminating system 13, and a reflected light beam from the original document 11 is transmitted through the mirror 14 to the imaging optical system 15 and focused on the CCD sensor 14, for conversion of the received optical information into electrical signals. FIG. 10 is a block diagram of an electric circuit for processing the output of the CCD sensor to a printer. The output signal X from the pixel 2A of the CCD sensor 16 and the output signals Y from the pixels 2B are supplied to an operation circuit 17.

In said operation circuit 17, the signal Y from the pixels 2B is converted in sign, suppressed in intensity and synthesized with the signal X from the pixel 2A. Consequently a pixel in the CCD sensor shows a sensitivity distribution as shown in FIG. 6. The output of the operation circuit 17 is digitized by an A/D converter 18 and supplied to a printer 19 for obtaining a printout according to the output signal of the CCD sensor.

Figure 1:
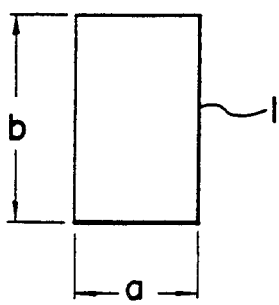
FIG. 1(A) is a schematic view of a pixel of a conventional solid-state imaging device.
FIG. 1(B) is a schematic view showing arrangement of pixels in a conventional solid-state imaging device.
Figure 1:
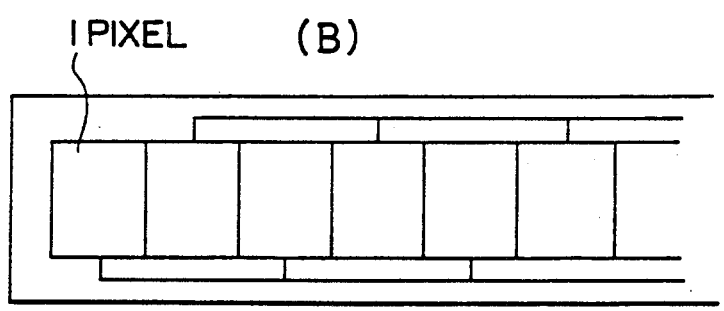
Figure 2:
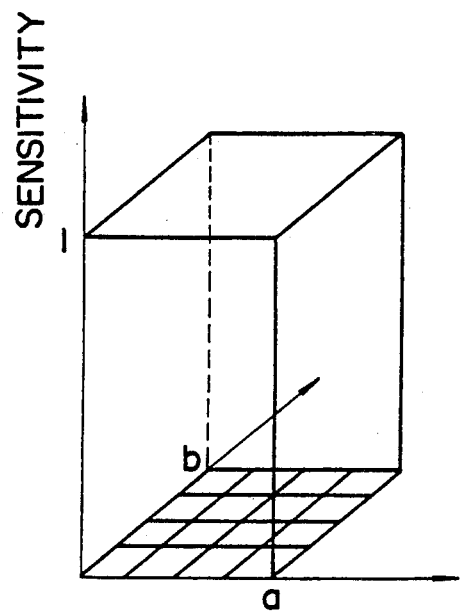
FIG. 2 is a view showing sensitivity distribution of a pixel in a conventional solid-state imaging device.
Figure 3:
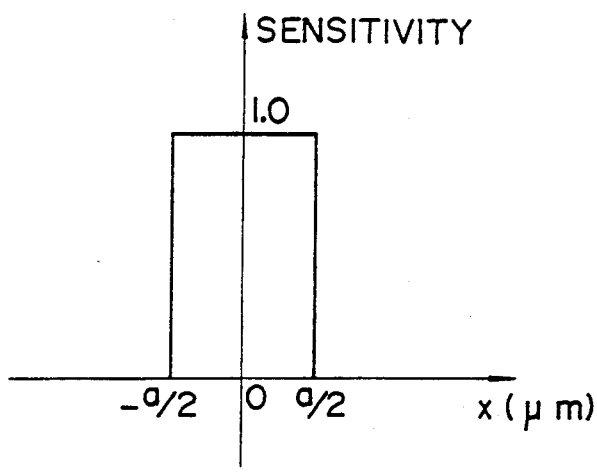
FIG. 3 is a chart of one-dimensional representation of sensitivity distribution of a conventional pixel.
Figure 4:
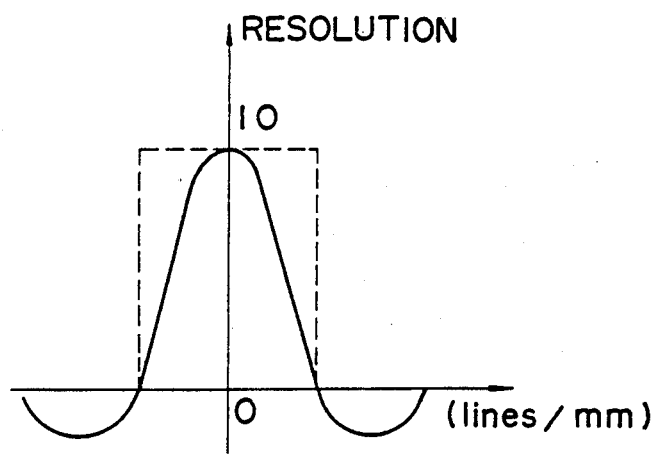
FIG. 4 is a chart of a resolution curve of the pixel shown in FIG. 3.
Figure 11:
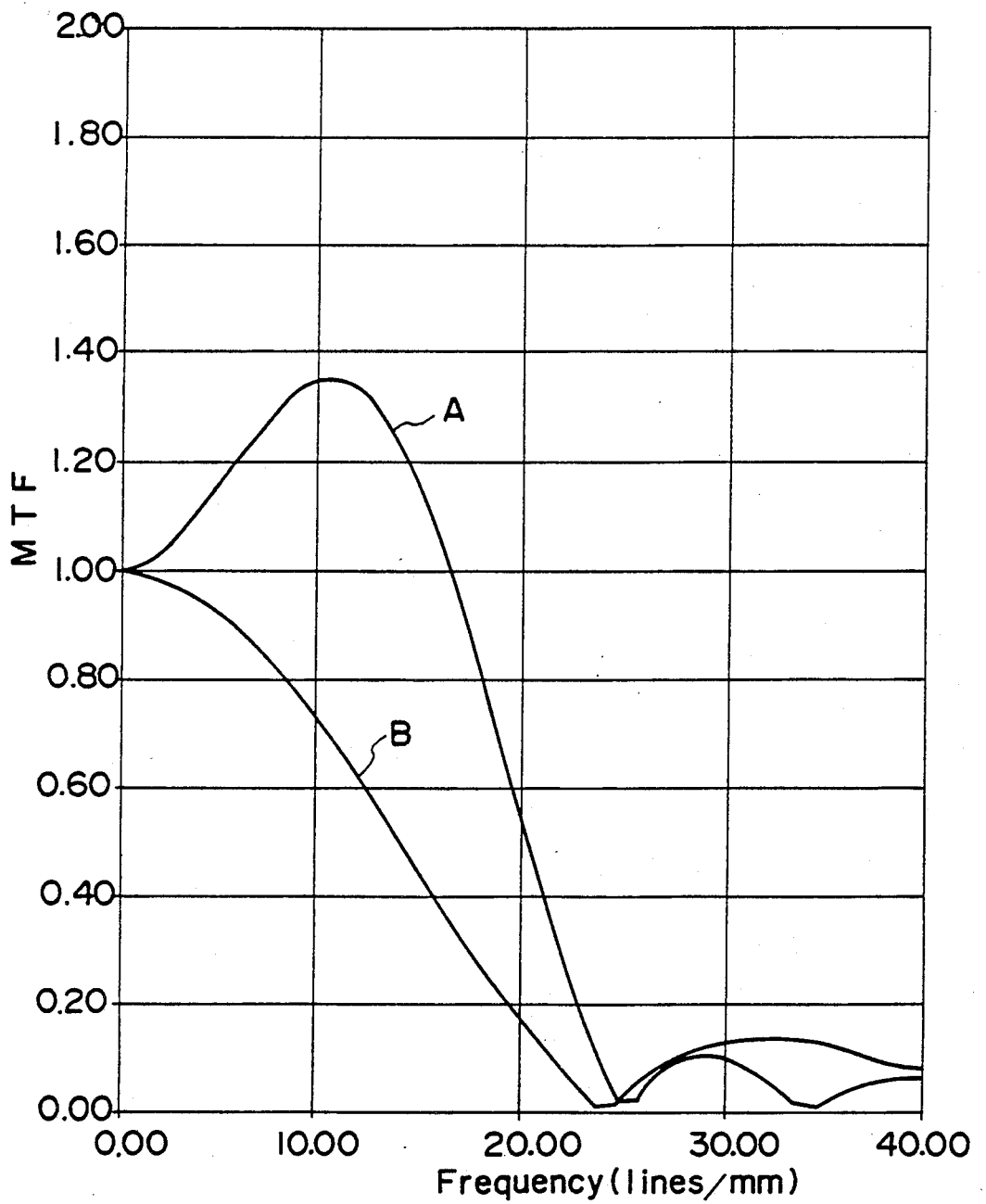
FIG. 11 is a chart comparing the modulation transfer functions of an embodiment of the present invention and a conventional solid-state imaging device.

FIG. 11 compares the modulation transfer functions (MTF) of the solid-state imaging device of the present invention and of a conventional solid-state imaging device. A curve A is the MTF of a solid-state imaging device having circular pixels as shown in FIG. 3, wherein the pixel 2A has a diameter of 50 $\mu$m while the pixel 2B has an outer diameter of 100 $\mu$m (corresponding to $\alpha=25$ $\mu$m and $\beta=50$ $\mu$m in FIG. 5) while a curve B is the MTF of a conventional solid-state imaging device. The negative areas of the MTF's are illustrated with inverted sign. In comparison with the conventional device, the solid-state imaging device of the present invention shows a higher value by 1.5 times or more at a spatial frequency of 10 lines/mm.

Figure 12:
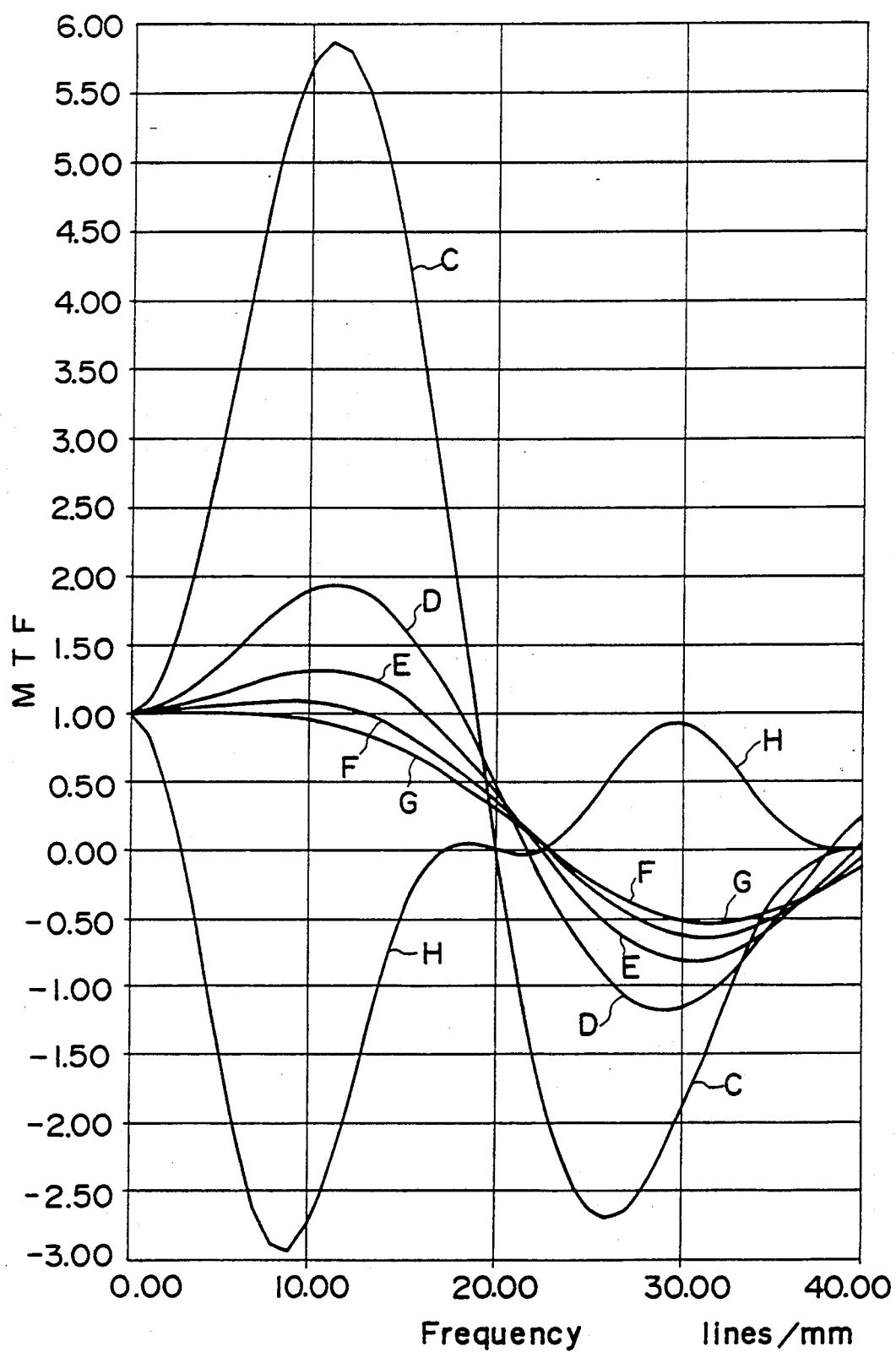
FIG. 12 is a chart showing the change in the modulation transfer function when the ratio of widths of pixels 2A and 2B varies.

FIG. 12 shows the change in MTF when the ratio of the width a of the pixel 2A to the width $b_0$ of the pixels 2B varies. Curves C, D, E, F, G and H respectively correspond to ratios $a_0:b_0=2:1$, 3:1, 4:1, 5:1, 6:1 and 1:1. A ratio $a_0:b_0=2:1$ provides a largest improvement in the MTF, thus enabling most effective edge enhancement regardless of the magnitude of h.

For an original image containing a large amount of high frequency components such as a screen tone image, the signal of the pixels 2B should not be inverted to negative but is used in the positive state. This change corresponds to an increase in the aperture of a pixel and permits the reduction of the Moire pattern caused by the high frequency components of the screen pattern, arrangement of the apertures and the size of the apertures.

As explained in the foregoing, these embodiments allow, by a simple weighting structure having two small pixels on both sides of a pixel, to improve the effective sensitivity distribution, thereby achieving an effective edge enhancement.

What I claim is:

1. A solid-state imaging device comprising:
 a pixel having a main area and a sub-area positioned adjacent said main area, each area producing an output signal; and
 a processing circuit for (1) receiving the output signals from said main area and said sub-area, (2) suppressing an intensity of the sub-area output signal, (3) inverting a polarity of the sub-area output signal, and (4) combining the suppressed and inverted sub-area output signal with the main area output signal to provide a pixel output signal having enhanced sensitivity.

2. A device according to claim 1, wherein said sub-area includes two portions disposed on opposite sides of said main area, each portion having a width less than a width of said main area.

3. A device according to claim 1, wherein said sub-area comprises an annular portion disposed about a circular main area.

4. A device according to claim 3, wherein said annular portion comprises two arcuate portions.

5. A solid-state imaging apparatus comprising:
 a pixel having (1) a main portion producing a main signal upon receipt of light, and (2) first and second sub-portions disposed, respectively, on opposite sides of said main portions and producing first and second sub-signals upon receipt of light; and
 a processing circuit for (1) combining the first and second sub-signals into a sub-output signal, (2) inverting a sign of the sub-output signal, and (3) synthesizing the inverted sub-signal with the main signal to produce a pixel output signal.

* * * * *

UNITED STATES PATENT AND TRADEMARK OFFICE
CERTIFICATE OF CORRECTION

PATENT NO. : 4,989,060
DATED : January 29, 1991
INVENTOR(S) : Yoshiko Usui It is certified that error appears in the above-identified patent and that said Letters Patent is hereby corrected as shown below:

ON TITLE PAGE:

<u>At [56]</u>,

Insert --Attorney, Agent, or Firm--Fitzpatrick, Cella, Harper & Scinto--.

<u>COLUMN 1</u>,

Line 38, "$g\phantom{\int}_{-\infty}^{\infty}$" should read --$g\int_{-\infty}^{\infty}$--; and Line 41, "$=\phantom{\int}_{-a/2}^{a/2}$" should read --$=\int_{-a/2}^{a/2}$--.

<u>COLUMN 2</u>,

Line 41, "pixel." should read --pixel 2A.--.

<u>COLUMN 3</u>,

Line 32, "width a" should read --width $a_0$--.

Signed and Sealed this

Twenty-first Day of July, 1992

*Attest:*

DOUGLAS B. COMER

*Attesting Officer*   *Acting Commissioner of Patents and Trademarks*